United States Patent
Oohata et al.

(10) Patent No.: US 7,462,879 B2
(45) Date of Patent: *Dec. 9, 2008

(54) DISPLAY DEVICE AND DISPLAY UNIT USING THE SAME

(75) Inventors: Toyoharu Oohata, Kanagawa (JP); Hideharu Nakajima, Kanagawa (JP); Yoshiyuki Yanagisawa, Kanagawa (JP); Toshiaki Iwafuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 261 days.

This patent is subject to a terminal disclaimer.

(21) Appl. No.: 11/087,530

(22) Filed: Mar. 23, 2005

(65) Prior Publication Data
US 2005/0161686 A1    Jul. 28, 2005

Related U.S. Application Data

(63) Continuation of application No. 10/147,654, filed on May 15, 2002, now Pat. No. 7,297,985.

(30) Foreign Application Priority Data
May 15, 2001    (JP) .......................... P2001-144592

(51) Int. Cl.
H01L 33/00    (2006.01)
(52) U.S. Cl. ...................... 257/99; 257/91; 257/E25.02

(58) Field of Classification Search ............... 257/88, 257/91, 95, 99, E25.02, E33.006, E33.062, 257/E33.007, E33.005; 313/309, 336, 351
See application file for complete search history.

(56) References Cited

U.S. PATENT DOCUMENTS

| | | | |
|---|---|---|---|
| 6,867,539 B1 * | 3/2005 | McCormick et al. | 313/504 |
| 7,091,525 B2 * | 8/2006 | Oohata et al. | 257/95 |
| 2002/0153832 A1 * | 10/2002 | Yanagisawa et al. | 313/505 |
| 2005/0179044 A1 * | 8/2005 | Oohata et al. | 257/91 |

* cited by examiner

*Primary Examiner*—Thomas L. Dickey
*Assistant Examiner*—Fazli Erdem
(74) *Attorney, Agent, or Firm*—Bell, Boyd & Lloyd LLP

(57) ABSTRACT

A display device is formed by burying at least part of a light emitting device in an insulating material, wherein a drive electrode for the light emitting device is formed so as to be extracted on a surface of the insulating material. A display unit is produced by two-dimensionally arraying such light emitting devices on a base body. Since the display device is modularized by burying a light emitting device finely formed in an insulating material, to re-shape the light emitting device into a size easy to handle, it is possible to suppress the production cost of the display unit using such display devices, and to ensure a desirable handling performance of the light emitting device; for example, facilitate the carrying of the light emitting device or the mounting thereof on a base body.

6 Claims, 15 Drawing Sheets

DISPLAY DEVICE AND DISPLAY UNIT USING THE SAME

CROSS REFERENCE TO RELATED APPLICATIONS

The present application is a continuation of U.S. patent application Ser. No. 10/147,654 filed on May 15, 2002, now U.S. Pat. No. 7,297,985 the disclosure of which is herein incorporated by reference.

BACKGROUND OF THE INVENTION

The present invention relates both to a new display device modularized by burying a light emitting device in an insulating material, and to a display unit produced by two-dimensionally arraying such display devices.

In the case of assembling an image display unit by arraying light emitting devices in a matrix, if the image display unit is a liquid crystal display (LCD) or a plasma display panel (PDP), then light emitting devices have been directly formed on a substrate, while if the image display unit is a light emitting diode (LED) display, then single LED packages are arrayed on a substrate. For example, in the case of producing an image display unit such as an LCD or PDP, device isolation is impossible from the viewpoint of its structure and, accordingly, devices generally have been formed, at the beginning of the production process, in such a manner as to be spaced from each other with a pitch equivalent to a pixel pitch of a final image display unit.

On the other hand, in the case of producing an LED display, LED chips have been packaged by taking out LED chips after dicing, and individually connecting the LED chips to external electrodes by wire-bonding or bump-connection using flip-chip. Since an LED (Light Emitting Diode) representative of a light emitting device is expensive, an image display unit using such LEDs can be produced at a low cost by producing a large number of LEDs from one wafer. More specifically, the cost of an image display unit can be lowered by reducing the size of an LED chip from an ordinary size, about 300 µm square to several ten µm square, packaging such small-sized LED chips, and producing the image display unit using the LED chips thus packaged.

As described above, the related art LED display has been produced by a method of mechanically arraying expensive modularized LED packages at a high density on a base body, and connecting an external electrode of each LED package to an electrode formed on the base body. Such a production method is disadvantageous in that since not only packaging of each LED requires a large production cost but also carrying of each LED or mounting thereof on a base body takes a lot of steps, the productivity and fabrication cost of the LED display are degraded.

SUMMARY OF THE INVENTION

An object of the present invention is, therefore, to provide a display device, which can be modularized from a light emitting device without the need of the raised production cost, wherein the modularized display device has a structure capable of facilitating carrying of the display device or mounting thereof on a base body, thereby improving the productivity of the display devices and reducing the production cost thereof, and to provide a display unit using the display devices.

To achieve the above object, according to a first embodiment of the present invention, there is provided a display device including a light emitting device, wherein at least part of the light emitting device is buried in an insulating material, and a drive electrode for the light emitting device is formed so as to be extracted to a surface of the insulating material.

According to a second embodiment of the present invention, there is provided a display unit including: a number of display devices each of which includes a light emitting device, at least part of the light emitting device being buried in an insulating material and a drive electrode for the light emitting device being formed so as to be extracted to a surface of the insulating material, wherein the display devices are two-dimensionally arrayed on a base body.

As described above, according to the present invention, since a display device is modularized by burying a light emitting device finely formed in an insulating material so as to re-shape the light emitting device into a size easy to handle, it is possible to reduce the production cost of the display device as much as possible, to ensure the handling performance thereby and to facilitate the carrying performance thereof. Since drive electrodes for a light emitting device are formed so as to be extracted on a surface of the modularized display device, it is possible to simply connect the drive electrodes to a power source line and a signal line formed on a base body and hence to significantly facilitate the mounting of the display device on the base body.

Additional features and advantages of the present invention are described in, and will be apparent from, the following Detailed Description of the Invention and the Figures.

DETAILED DESCRIPTION OF THE INVENTION

Figure 1:
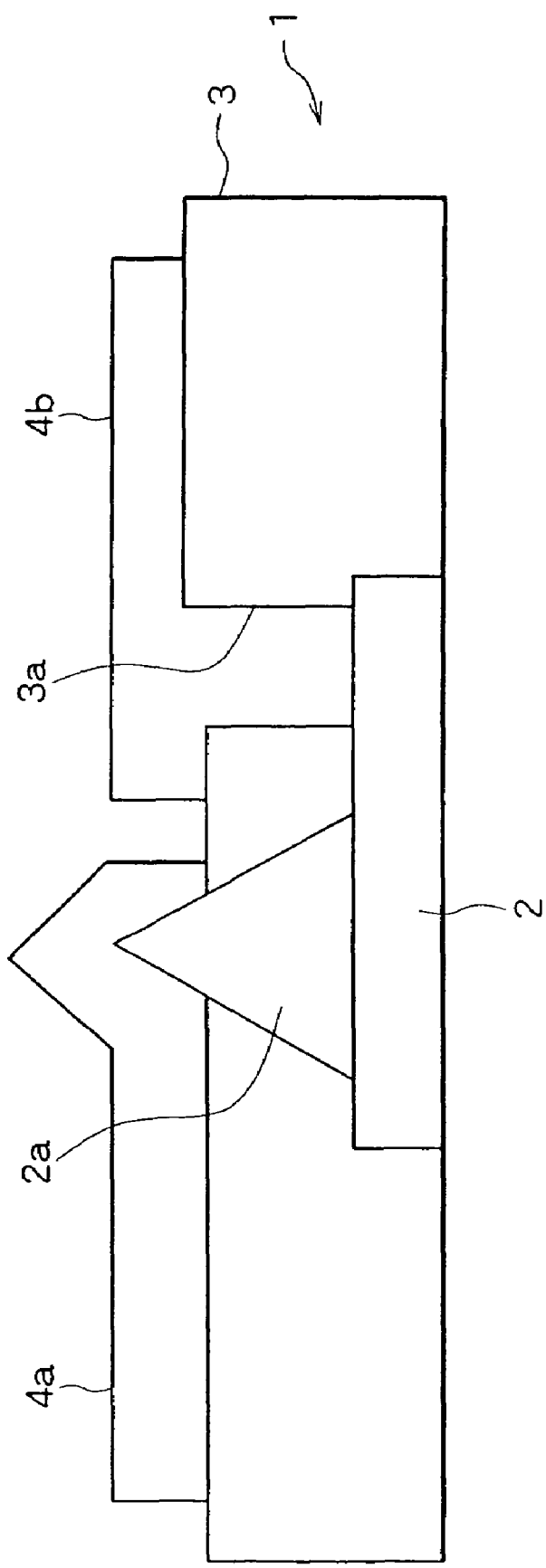
FIG. 1 is a schematic sectional view showing one example of a display device in which a light emitting device is buried in an insulating material.

Basic Structure of Display Device:

A display device 1 of the present invention has a configuration shown in FIG. 1, in which a light emitting device 2 is buried in an insulating material 3 such as polyimide resin or epoxy resin, and drive electrodes 4a and 4b are formed on surfaces of the insulating material 3. The light emitting device 2 has a shape whose sides converge in one direction, that is, includes a leading end portion 2a having a taper shape, for example, a conical shape or a polygonal pyramid shape. The leading end portion 2a is exposed from the insulating material 3, and the drive electrode 4a is connected to the exposed portion (p-electrode) of the leading end portion 2a. The other drive electrode 4b is connected to the other electrode (n-electrode) of the light emitting device 2 via an opening portion 3a formed in the insulating material 3.

The light emitting device 2 is configured as a GaN based light emitting diode formed; for example, on a sapphire substrate by crystal growth. Such a GaN light emitting diode has a feature that laser abrasion occurs by irradiation of a laser beam passing through the substrate, so that film peeling occurs at an interface between the sapphire substrate and a GaN based crystal growth layer due to a phenomenon that nitrogen in GaN is vaporized. As a result, it is easier to peel a GaN light emitting diode from the substrate.

Figure 2A:
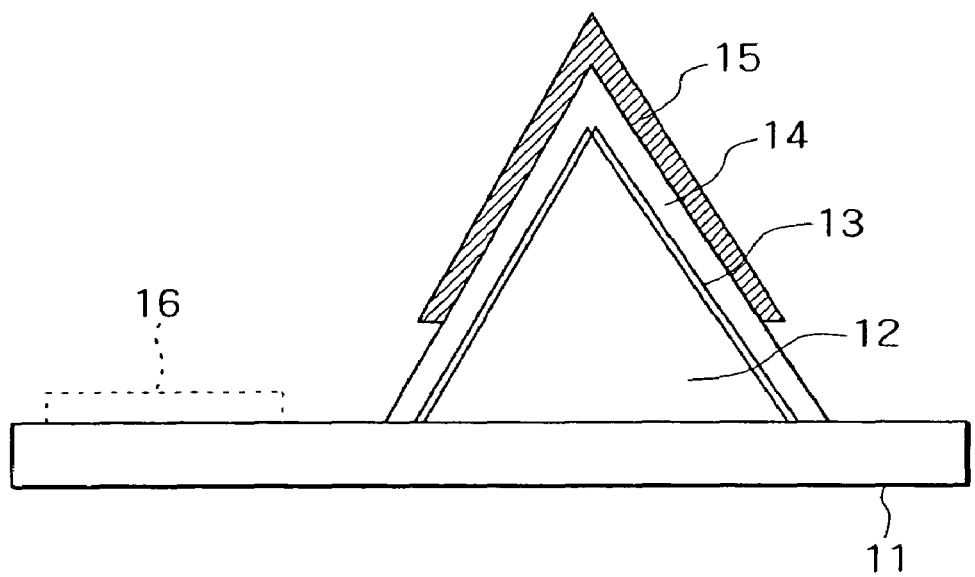
FIGS. 2A and 2B are a sectional view and a plan view showing one example of a light emitting device.
Figure 2B:
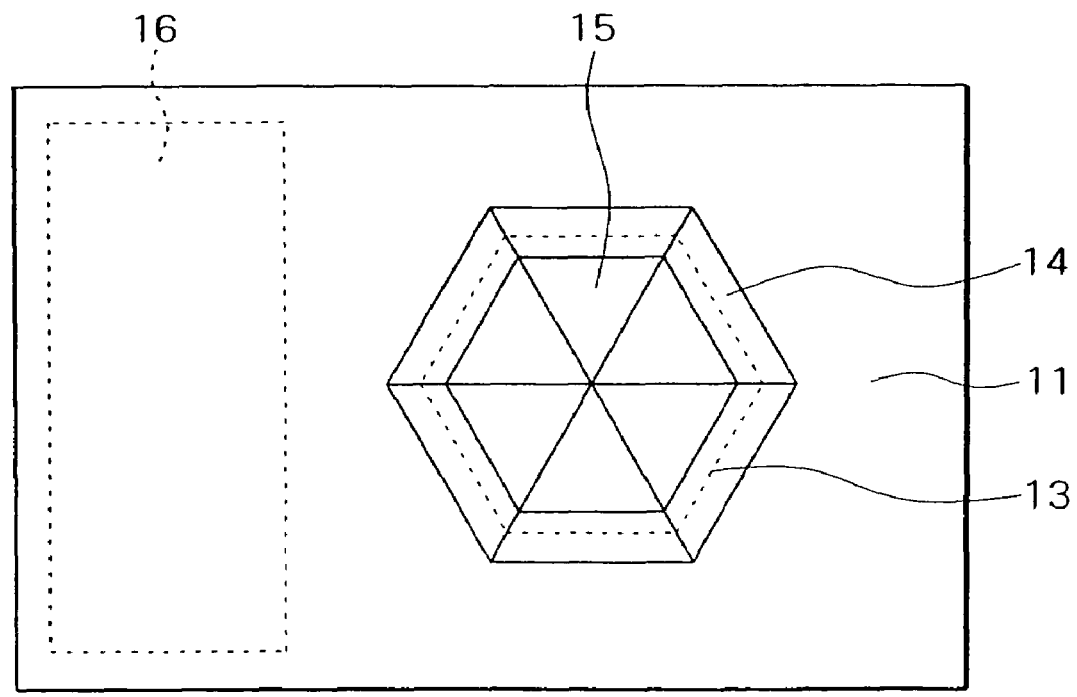

A structure of a GaN light emitting diode will be described with reference to FIGS. 2A and 2B. A hexagonal pyramid shaped GaN layer 12 is formed by selective grown on an underlying growth layer 11 made from GaN based semiconductor layer. More specifically, an insulating film (not shown) is formed on the underlying growth layer 11 and the hexagonal pyramid shaped GaN layer 12 is formed by selective growth from an opening portion having been formed in the insulating film by an MOCVD process or the like. If a C-plane of sapphire is used as a principal plane of the sapphire substrate used for crystal growth, then the GaN layer 12 has a silicon-doped region having a pyramid shape covered with an S-plane (1-101) plane. The tilt S-plane of the GaN layer 12 functions as a cladding layer of a double-hetero structure. An InGaN layer 13 as an active layer is formed so as to cover the tilt S-plane of the GaN layer 12, and a magnesium-doped GaN layer 14 is formed on the InGaN layer 13. The magnesium-doped GaN layer 14 also functions as a cladding layer.

A p-electrode 15 to be connected to the drive electrode 4a and an n-electrode 16 to be connected to the drive electrode 4b are formed on such a light emitting diode. The p-electrode 15 is formed by vapor-depositing a metal material such as Ni/Pt/Au or Ni(Pd)/Pt/Au on the magnesium-doped GaN layer 14. The n-electrode 16 is formed by vapor-depositing a metal material such as Ti/Al/Pt/Au in the opening portion formed in the above-described insulating film (not shown). It is to be noted that if n-electrode extraction is performed from a back surface side of the underlying growth layer 11, the n-electrode 16 is not required to be formed on a front surface side of the underlying growth layer 11.

A GaN based light emitting diode having such a structure allows emission of light of not only red and green but also blue. Moreover, it can be relatively simply peeled from a sapphire substrate by laser abrasion and, therefore, selectively peeled from the sapphire substrate by selective irradiation of a laser beam. A GaN based light emitting diode may have a structure that an active layer is formed in a flat shape or a band shape, or may have a pyramid shaped structure that a C-plane is formed on an upper end portion. The light emitting device is not limited to a GaN based light emitting diode but may be another nitride based light emitting device or another compound semiconductor device.

According to the above-described basic structure of the display device of the present invention, although the light emitting device 2 is finely formed, the display device 1 having a size being large enough to allow easy handling can be obtained by covering the display device 1 with a resin. The dense array of the light emitting devices 2 each of which is finely formed contributes to a reduction in cost. Further, each of the drive electrodes 4a and 4b is not limited by the size of the light emitting device 2 but can be formed into a size being large sufficient for re-wiring in the subsequent step.

Figure 3:
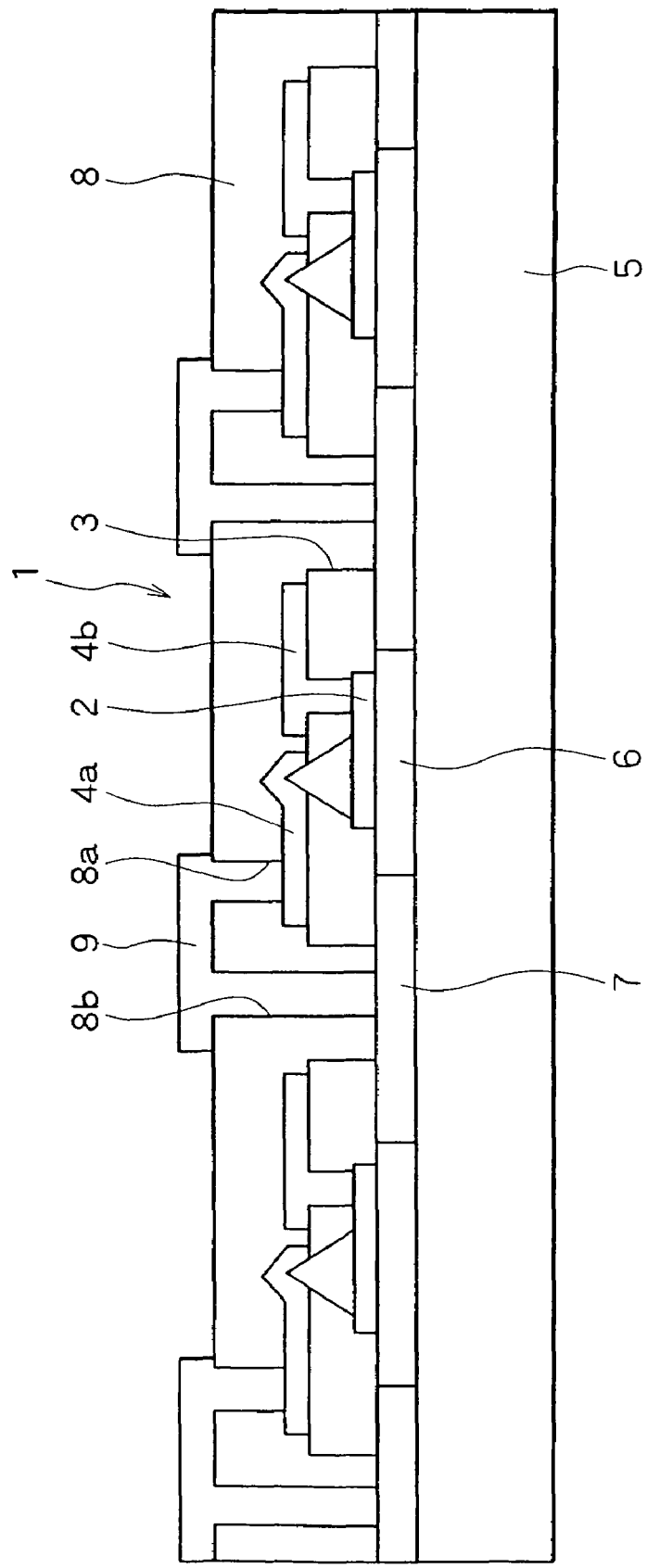
FIG. 3 is a schematic sectional view showing one example of a display unit in which modularized display devices are two-dimensionally arrayed.

Configuration Example of Display Unit:

A display unit can be configured by two-dimensionally arraying, on a base body, the display devices 1, each of which is previously modularized by covering the light emitting device 2 with the insulating material 3. FIG. 3 shows one example of a display unit in which the display devices 1 are arrayed on a base body 5. The base body 5 is made from a transparent material such as glass. Electrodes 7 and die-bonding materials 6 for fixing the display devices 1 are formed on a surface of the base body 5, and the display devices 1 are two-dimensionally arrayed and fixed on the base body 5 via of the die-bonding materials 6.

The display devices 1 are covered with an insulating layer 8. A drive electrode 4a for each of the display devices 1 is connected to an electrode 7 formed on the base body 5 via a wiring layer 9 buried in opening portions 8a and 8b formed in the insulating layer 8. In this case, since a height of the drive electrode 4a is raised up by a thickness of the display device 1, a thickness of a portion, formed on the display device 1, of the insulating layer 8 is thinner than a thickness of a portion, not formed on the display device 1 (for example, a portion formed on the electrode 7), of the insulating layer 8. Accordingly, the opening portion 8a formed in the insulating layer 8 at a position corresponding to the drive electrode 4a may be a shallow via-hole and, therefore, even if the drive electrode 4a has a fine area, it can be desirably connected to the wiring layer 9 via the opening portion 8a formed as the shallow via-hole. On the other hand, the opening portion 8b formed in the insulating layer 8 at a position corresponding to the electrode 7 is required to be formed as a via-hole deeper than the opening portion 8a. However, since the size of the electrode 7 formed on the base body can be made larger than the size of the drive electrode 4a, the aspect ratio of the opening portion 8b can be lowered by making the diameter of the opening portion 8b large. As a result, the electrode 7 can be desirably connected to the wiring layer 9 via the opening portion 8b.

In the display unit having the above-described configuration, light emitted from the light emitting device 2 is viewed from the base body 5 side. In other words, the base body 5 becomes a front surface panel of the display unit. In this case, since the light emitting device 2 has the leading end portion 2a having a conical shape or a polygonal pyramid shape, light emitted therefrom is concentrated on the front surface without the need of any additional parts, whereby brightness on the front side of the display unit can be ensured. In addition, light emitted from the light emitting device 2 passes through the die-bonding material 6. However, since the die-bonding material 6 is extremely thin, the die-bonding material 6 does not obstruct the passing of light emitted from the light emitting device 2. Of course, if the die-bonding material 6 is formed by a transparent material, it is possible to further suppress attenuation of light passing therethrough. On the other hand, since the insulating layer 8 is located on the back surface side of the light emitting device 2, the light permeability of the insulating layer 8 is not taken into account. In an extreme case, the insulating layer 8 may have no light permeability. Accordingly, the degree of freedom in selection of a material used for the insulating layer 8 can be extended.

As described above, in the display device and the display unit according to the present invention, an expensive light emitting device (for example, an LED) is formed into a size being as fine as, for example, 20 μm square, and further, 5 μm or less, and is covered with an insulating material, for example, a plastic material such as polyimide resin or epoxy resin into a large resin-covered chip having a height being substantially equal to a height of the light emitting device. Subsequently, electrodes connected to a p-electrode and an n-electrode of the light emitting device are extracted on the insulating material. As a result, it is possible to ensure a handling performance of a fine light emitting device and, hence, to easily connect a power source line and a signal line to the light emitting device.

Production of Display Unit by Two-step Enlarged Transfer Method:

As described above, the display device of the present invention is modularized by burying a fine light emitting device in an insulating material, to re-shape the light emitting device into a large-sized resin-covered chip, thereby significantly improving the handling performance of the light emitting device. Such modularized display devices can be used for producing the display unit shown in FIG. 3. More specifically, the display unit shown in FIG. 3 can be produced by enlargedly transferring light emitting devices modularized into display devices, that is, formed into large-sized resin-covered chips.

Hereinafter, a method of producing a display unit according to the present invention will be described by example a two-step enlarged transfer method.

The two-step enlarged transfer method is carried out by transferring devices, which are previously formed on a first substrate at a high density, onto a temporarily holding member in such a manner that the devices are spaced from each other with a pitch larger than a pitch of the devices arrayed on the first substrate, and further transferring the devices held on the temporarily holding member onto a second substrate in such a manner that the devices are spaced from each other with a pitch larger than the pitch of the devices held on the temporarily holding member. Although two-step transfer is adopted in this embodiment, multi-step transfer such as three or more-step transfer can be adopted in accordance with a required enlargement ratio between the pitch of the devices arrayed on the first substrate and the pitch of the devices mounted on the second substrate.

FIGS. 4A to 4D show basic steps of the two-step enlarged transfer method. First, devices 22 such as light emitting devices are densely formed on a first substrate 20 shown in FIG. 4A. By densely forming devices on a substrate, the number of devices formed per each substrate can be increased, to reduce a production cost thereof. The first substrate 20 may be selected from substrates on each of which devices can be formed, for example, a semiconductor wafer, a glass substrate, a quartz glass substrate, a sapphire substrate, and a plastic substrate. The devices 22 may be directly formed on the first substrate 20, or may be formed once on another substrate, and then transferred and arrayed on the first substrate 20.

Figure 4:
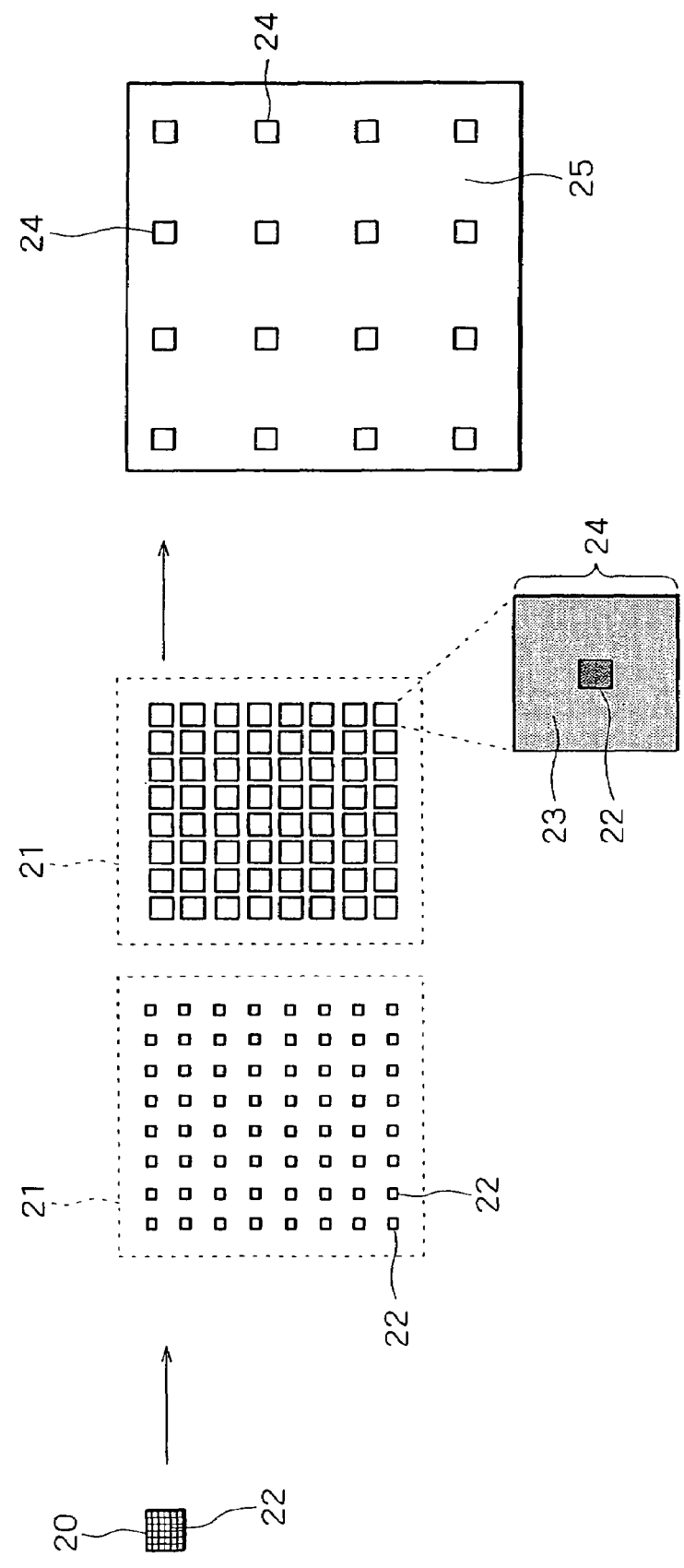
FIGS. 4A to 4D are typical views showing a method of arraying devices.
Figure 5:
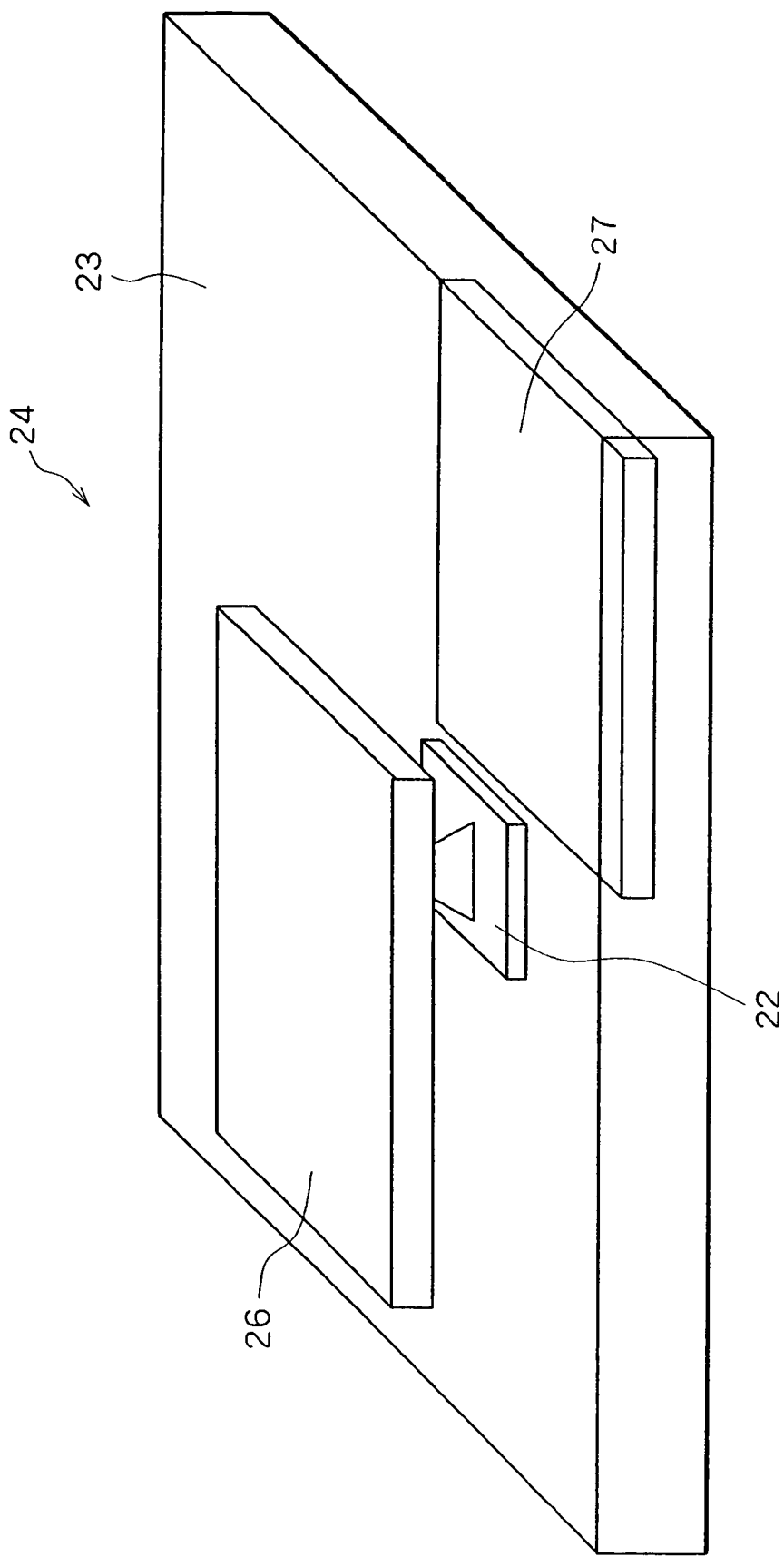
FIG. 5 is a schematic perspective view of a resin-covered chip.
Figure 6:
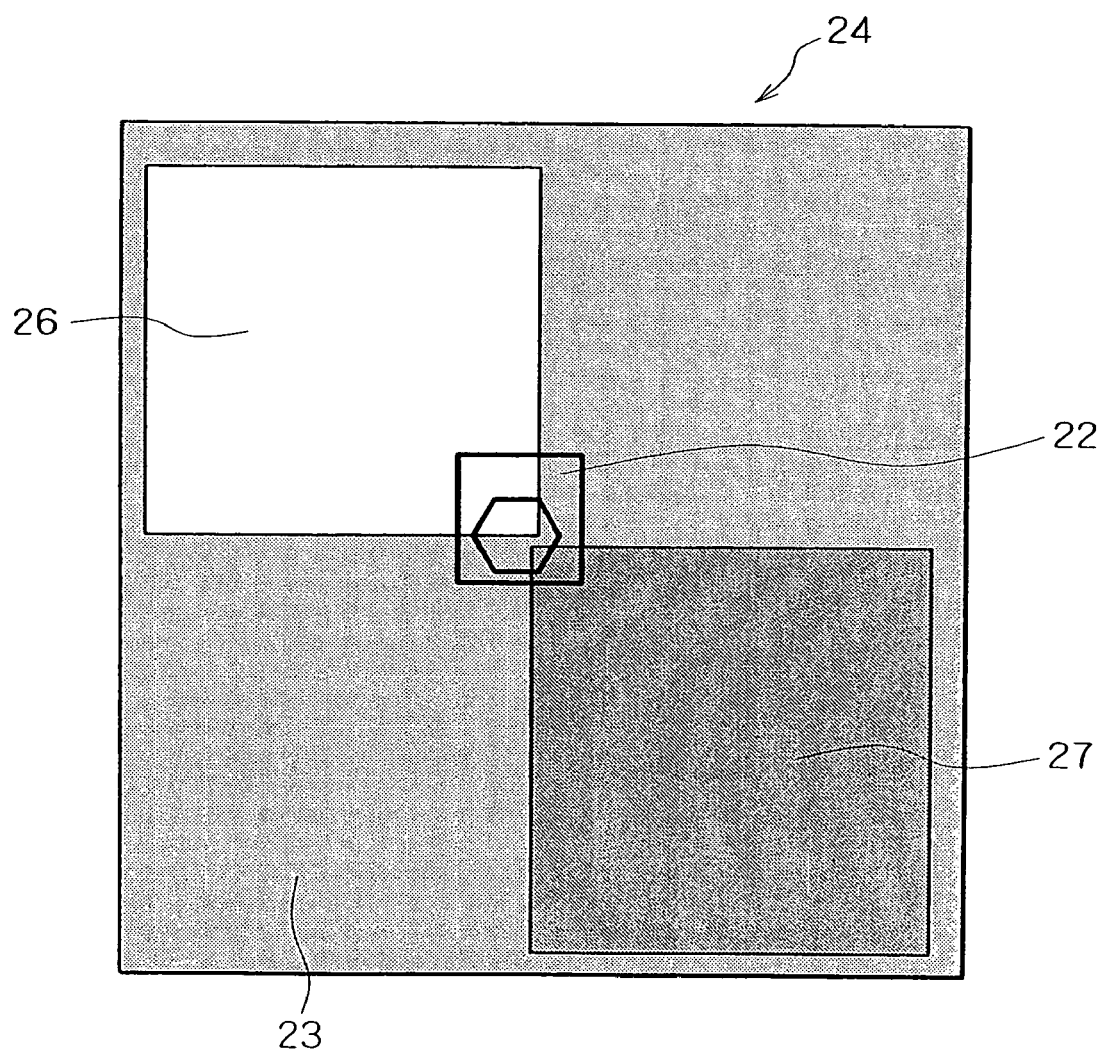
FIG. 6 is a schematic plan view of the resin-covered chip.

As shown in FIG. 4B, the devices 22 are transferred from the first substrate 20 onto a temporarily holding member 21 as shown by broken lines in FIG. 4B, and held on the temporarily holding member 21. On the temporarily holding member 21, the adjacent two of the devices 22 are enlargedly spaced from each other to be arrayed in a matrix as shown in FIG. 4B. More specifically, the devices 22 are transferred onto the temporarily holding member 21 in such a manner as to be enlargedly spaced from each other not only in the X direction but also in the Y direction perpendicular to the X direction. The enlarged distance between the adjacent two of the devices 22 on the temporarily holding member 21 is not particularly limited, but may be determined, for example, in consideration of formation of resin portions and formation of electrode pads in the subsequent steps. The devices 22 on the first substrate 20 can be all transferred from the first substrate 20 onto the temporarily holding member 21 in such a manner as to be enlargedly spaced from each other. In this case, a size of the temporarily holding member 21 in each of the X direction and the Y direction may be equal to or more than a value obtained by multiplying the enlarged distance by the number of those, arrayed in each of the X direction and the Y direction, of the devices 22 arrayed in the matrix on the temporarily holding member 21. In addition, part of the devices 22 on the first substrate 20 may be transferred onto the temporarily holding member 21 in such a manner as to be enlargedly spaced from each other.

After such a first transfer step, as shown in FIG. 4C, each of the devices 22 enlargedly spaced from each other on the temporarily holding member 21 is covered with a resin, and electrode pads are formed on the resin covering the device 22. The reason why each device 22 is covered with the resin is to facilitate the formation of the electrode pads for the device 22 and to facilitate the handling of the device 22 in the subsequent second transfer step. To prevent occurrence of a wiring failure in a final wiring step performed after the second transfer step (which will be described later), the electrode pads are formed into relatively large sizes. It is to be noted that the electrode pads are not shown in FIG. 4C. As shown in FIG. 4C, a resin-covered chip 24 (equivalent to the display device of the present invention) is thus formed by covering each of the devices 22 with a resin 23. The device 22 is located at an approximately central portion of the resin-covered chip 24 in a plan view according to this embodiment; however, the device 22 may be located at a position offset to one side or a corner of the resin-covered chip 24.

As shown in FIG. 4D, a second transfer step is then carried out. In this second transfer step, the devices 12 arrayed in the matrix on the temporarily holding member 21 in the form of the resin-covered chips 24 are transferred on a second substrate 25 in such a manner as to be more enlargedly spaced from each other.

Even in the second transfer step, adjacent two of the devices 22 in the form of the resin-covered chips 24 are more enlargedly spaced from each other as compared with the first transfer step, to be arrayed in a matrix shown in FIG. 4D. More specifically, the devices 22 are transferred in such a manner as to be more enlargedly spaced from each other as compared with the first transfer step, not only in the X direction but also in the Y direction. If positions of the devices 22 arrayed on the second substrate 25 in the second transfer step correspond to positions of pixels of a final product such as an image display unit, then a pitch of the devices 22 arrayed on the second substrate 25 in the second transfer step becomes about integer times an original pitch of the devices 22 arrayed on the first substrate 20. Assuming that an enlargement ratio between the pitch of the devices 22 held on the temporarily holding member 21 and the pitch of the devices 22 arrayed on the first substrate 20 is taken as "n" and an enlargement ratio between the pitch of the devices 22 arrayed on the second substrate 25 and the pitch of the devices 22 held on the temporarily holding member 21 is taken as "m", a value E of the above-described about integer times is expressed by $E = n \times$ m. The enlargement ratios "n" and "m" may be set to integers; however, they may not be integers insofar as they are selected such that the value E becomes an integer. For example, if the ratio "n" is set to 2.4 (not an integer) and the ratio "m" is set to 5 (integer), then the value E becomes 12 (integer).

The devices 22 in the form of the resin-covered chips 24, which are sufficiently enlargedly spaced from each other on the second substrate 25, are then subjected to wiring. The wiring is performed with care taken not to cause a connection failure by making use of the previously formed electrode pads and the like. If the devices 22 are light emitting devices such as light emitting diodes, then the wiring includes wiring to p-electrodes and n-electrodes. If the devices 22 are liquid crystal control devices, then the wiring includes wiring to selective signal lines, voltage lines, alignment electrode films, and the like.

In the two-step enlarged transfer shown in FIGS. 4A to 4D, each device 22 is covered with the resin and electrode pads are formed on the resin covering the device 22 by making use of the enlarged distance between adjacent two of the devices 22 after the first transfer, wiring can be performed after the second transfer without occurrence of any connection failure by making use of the previously formed electrode pads and the like. As a result, it is possible to improve a production yield of the image display unit. Further, the two-step enlarged transfer method according to this embodiment includes the two enlarged transfer steps in each of which the devices are enlargedly spaced from each other. By performing a number of such enlarged transfer steps in each of which the devices are enlargedly spaced from each other, the number of transfers can be actually reduced. For example, assuming that an enlargement ratio between the pitch of the devices 22 on the temporarily holding member 21 and the pitch of the devices 22 on the first substrate 20 is taken as 2 (n=2) and an enlargement ratio between the pitch of the devices 22 on the second substrate 25 and the pitch of the devices 22 on the temporarily holding member 21 is taken as 2 (m=2), the total enlargement ratio becomes 2×2=4. To achieve the total enlargement ratio (=4), according to a one-step transfer method, the number of transfers (alignment) of the devices 22 from the first substrate 20 to the second substrate 25 becomes 16 (=$4^2$) times. On the contrary, to achieve the same total enlargement ratio (=4), according to the two-step enlarged transfer method of this embodiment, the number of transfers (alignment) is obtained by adding a square of the enlargement ratio (=2) in the first transfer step, that is, 4 (=$2^2$) times to a square of the enlargement ratio (=2) in the second transfer step, that is, 4 (=$2^2$) times and, therefore, the number of transfers becomes 8 (=4+4) times. Specifically, according to the two-step enlarged transfer method, to achieve the total enlargement ratio (transfer magnification) of n×m, the total number of transfers becomes ($n^2+m^2$) times, while according to the one-step transfer method, to achieve the same total enlargement ratio (transfer magnification) of n×m, the number of transfers becomes $(n+m)^2 = n^2 + 2nm + m^2$. As a result, according to the two-step enlarged transfer method, the number of transfers can be made smaller than that according to the one-step transfer method by 2 nm times, thereby saving time and cost required for the production step. This becomes more significant as the total enlargement ratio becomes large.

The resin-covered chip used as the display device in the above-described two-step enlarged transfer method will be described below. The resin-covered chip 24 has a basic structure, which is the same as the structure of the display device shown in FIG. 1 except that one electrode pad is formed on a back surface side of the light emitting device 22. The resin-covered chip 24 is formed into an approximately flat plate shape with an approximately square shaped principal plane. The resin-covered chip 24 has a shape of the cured resin 23 covering the light emitting device 22. More specifically, the resin-covered chips 24 are obtained by coating the overall surface of the temporarily holding member 21 so as to cover the devices 22 with a non-cured resin 23, curing the resin 23, and cutting edge portions of the cured resin 23 into square chips by dicing.

Electrode pads 26 and 27 are formed on front and back surface sides of the approximately flat plate like resin 23, respectively. These electrode pads 26 and 27 are each produced by forming a conductive layer made from a metal or polysilicon as a material for forming each of the electrode pads 26 and 27 overall on each of the front and back surfaces of the resin 23, and patterning the conductive layer into a specific electrode shape by photolithography. These electrode pads 26 and 27 are formed so as to be connected to a p-electrode and an n-electrode of the device 22 as the light emitting device, respectively. In this case, via-holes may be formed in the resin 23 as needed.

In the example shown, the electrode pads 26 and 27 are formed on the front and back surface sides of the resin-covered chip 24, respectively. However, they may be formed on either of the front and back surface sides of the resin-covered chip 24. The reason why the electrode pads 26 and 27 are offset from each other in the horizontal direction is to prevent the electrode pads 26 and 27 from being overlapped to each other in the case of forming a contact hole from above at the time of formation of final wiring. The shape of each of the electrode pads 26 and 27 is not limited to a square shape but may be any other shape.

The formation of such a resin-covered chip 24 is advantageous in that since the device 22 is covered with the flattened resin 23, the electrode pads 26 and 27 can be accurately formed on the flattened front and back surfaces of the resin 23, and the electrode pads 26 and 27 can be formed so as to extend to a region wider than the size of the device 22, thereby facilitating the handling of the device 22 at the time of transfer by an attracting jig in the second transfer step. As will be described later, since final wiring is performed after the second transfer step, a wiring failure can be prevented by performing wiring using the electrode pads 26 and 27 having relatively large sizes.

Figure 7:
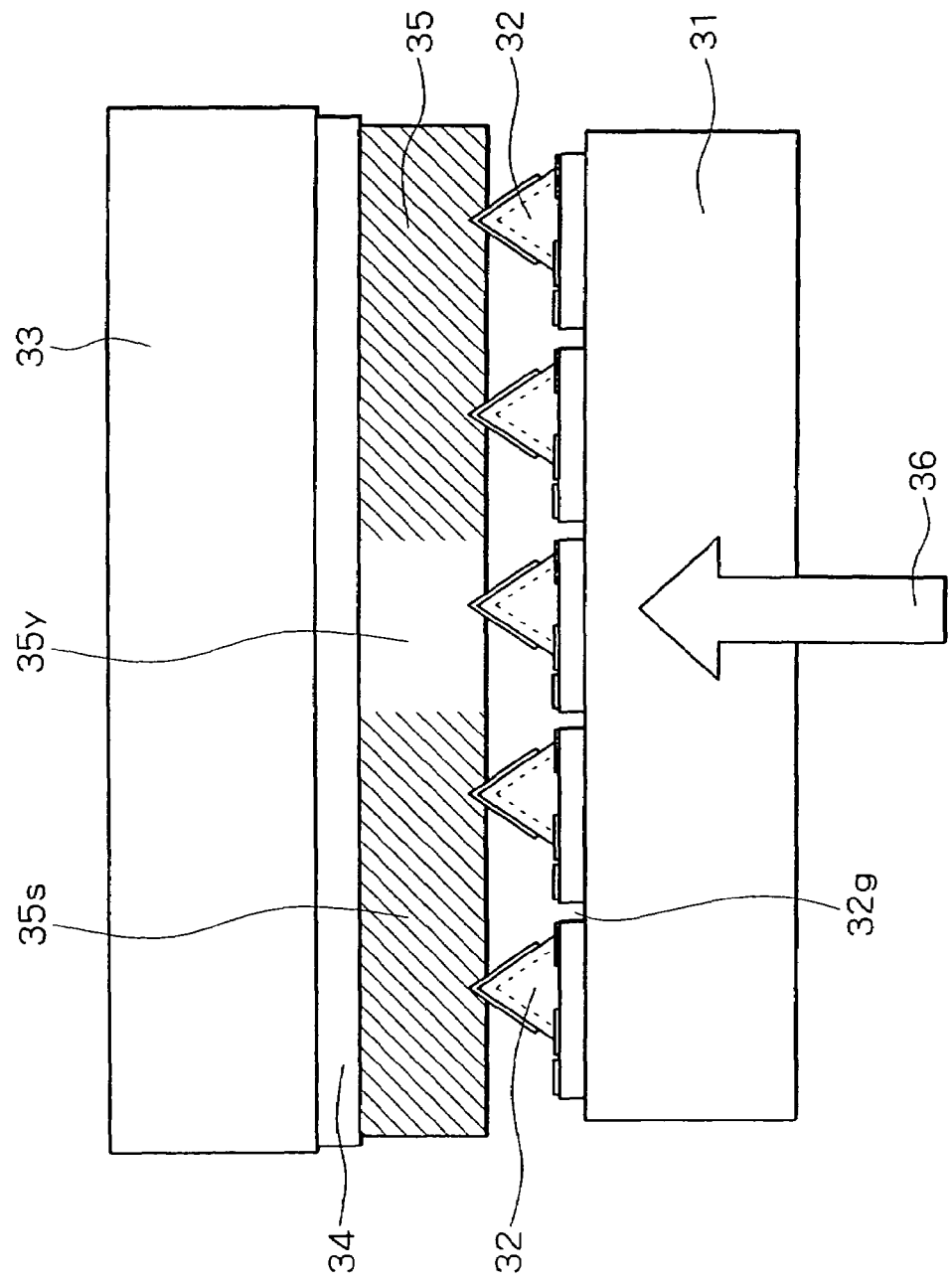
FIG. 7 is a schematic sectional view showing a first transfer step.

A concrete method of arraying the light emitting devices shown in FIGS. 4A to 4D will be described below with reference to FIGS. 7 to 13. First, as shown in FIG. 7, a number of light emitting diodes 32 are formed in a matrix on a principal plane of a first substrate 31. A size of the light emitting device 32 is set to about 20 μm. The first substrate 31, which is made from a material having a high transmittance for a wavelength of a laser beam used for irradiation of the light emitting diode 32, is typically configured as a sapphire substrate. The light emitting diode 32 is already provided with a p-electrode and the like but is not subjected to final wiring. Device isolation grooves 32g are formed, whereby the light emitting diodes 32 are isolatable from each other. The grooves 32g are formed, for example, by reactive ion etching. As shown in FIG. 7, such a first substrate 31 is placed opposite to a temporarily holding member 33 for selective transfer of the light emitting diodes 32 therebetween.

Both a release layer 34 and an adhesive layer 35 are formed on a surface, opposed to the first substrate 31, of the temporarily holding member 33. As the temporarily holding member 33, there can be used a glass substrate, a quartz glass substrate, or a plastic substrate. The release layer 44 on the temporarily holding member 33 can be made from a fluorine coat material, a silicone resin, a water soluble adhesive (for example, polyvinyl alcohol: PVA), or polyimide. The adhesive layer 35 on the temporarily holding member 33 can be made from an ultraviolet (UV)-curing type adhesive, a thermosetting type adhesive, or a thermoplastic type adhesive. As one example, a quartz glass substrate is used as the temporarily holding member 33, and a polyimide film is formed as the release layer 34 on the temporarily holding member 33 to a thickness of 4 µm and an UV-curing type adhesive layer is formed as the adhesive layer 35 on the release layer 34 to a thickness of about 20 µm.

The adhesive layer 35 provided on the temporarily holding member 33 is adjusted such that cured regions 35s and non-cured regions 35y are mixed in the adhesive layer 35. The first substrate 31 is positioned to the temporarily holding member 33 such that the light emitting diodes 32 to be selectively transferred are located at the non-cured regions 35y. The adjustment of the adhesive layer 35 in such a manner that the cured regions 35s and the non-cured regions 35y are mixed in the adhesive layer 35 may be performed by selectively exposing portions, spaced from each other with a pitch of 200 µm, of the UV-curing type adhesive layer 35 by an exposure system, so that the portions to which the light emitting diodes 32 are to be transferred remain non-cured and the other portions are cured. After such selective curing of the adhesive layer 35, each of the light emitting diodes 122 to be transferred, which are located at the non-cured regions 35y, is irradiated with a laser beam from a back surface of the first substrate 31, and is then peeled from the first substrate 31 by laser abrasion. Since the GaN based light emitting diode 32 is decomposed into gallium and nitrogen at an interface between the GaN layer and sapphire, the light emitting diode 32 can be relatively simply peeled from the first substrate 31. The laser beam used for irradiation is exemplified by an excimer laser beam or a harmonic YAG laser beam.

The light emitting diode 32, which has been selectively irradiated with a laser beam, is peeled from the first substrate 31 at the interface between the GaN layer and the first substrate 31 by laser abrasion, and is transferred to the opposed temporarily holding member 33 in such a manner that the p-electrode portion of the light emitting diode 32 is pieced in the corresponding non-cured region 35y of the adhesive layer 35. The other light emitting diodes 32, which have been not irradiated with laser beams and also located at positions corresponding to the cured region 35s of the adhesive layer 35, are not transferred to the temporarily holding member 33. It is to be noted that, in the example shown in FIG. 7, only one light emitting diode 32 is selectively irradiated with a laser beam. However, in reality, the light emitting diodes 32 spaced from each other with an n-pitch are similarly irradiated with laser beams. With such selective transfer, the light emitting diodes 32 are arrayed on the temporarily holding member 33 in such a manner as to be enlargedly spaced from each other with a pitch larger than an original pitch of the light emitting diodes 32 arrayed on the first substrate 31.

Figure 8:
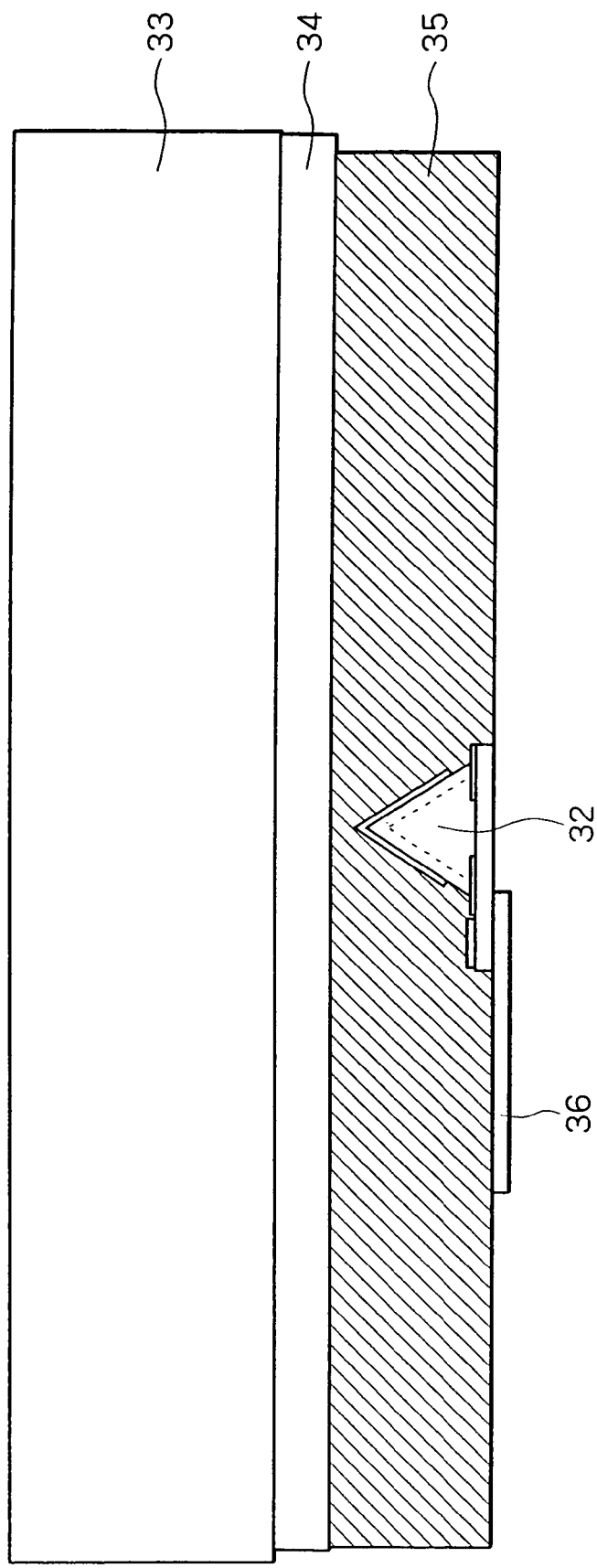
FIG. 8 is a schematic sectional view showing an electrode pad formation step.

In the state that the light emitting diode 32 is held by the adhesive layer 35 of the temporarily holding member 33, a back surface of the light emitting diode 32, which is taken as an n-electrode side (cathode electrode side), is cleaned for removal of the resin (adhesive) therefrom. Accordingly, as shown in FIG. 8, when an electrode pad 36 is formed on the back surface of the light emitting diode 32, it can be electrically connected thereto.

As one example of cleaning of the adhesive layer 35, the resin forming the adhesive is etched with oxygen plasma and cleaned by irradiation of UV ozone. Further, when the GaN based light emitting diode is peeled from the first substrate 31 made from sapphire substrate by laser irradiation, gallium is deposited on the peeling plane and, accordingly, such an element must be etched; for example, by using an NaOH containing water solution or dilute nitric acid. The electrode pad 36 is then patterned. At this time, the electrode pad 36 on the cathode side can be formed into a size of about 60 µm square. As the electrode pad 36, there can be used a transparent electrode (ITO or ZnO based electrode) or a Ti/Al/Pt/Au electrode. In the case of using a transparent electrode, even if the electrode largely covers the back surface of the light emitting diode, it does not shield light emission. Accordingly, a patterning accuracy of the transparent electrode may be rough and the size of the electrode can be made large, to thereby facilitate the patterning process.

After the formation of the electrode pad 36, the cured adhesive layer 35 is cut for each light emitting diode 32 by a dicing process into each resin-covered chip corresponding to the light emitting diode 32. The dicing process is performed by dicing using mechanical parts or laser dicing using a laser beam. A cut-in width by dicing is largely dependent on the size of the light emitting diode 32 covered with the adhesive layer 35 within a pixel of an image display unit, and if a cut-in width being as narrow as 20 µm or less is needed, the dicing is required to be performed by laser dicing using a laser beam such as an excimer laser beam, a harmonic YAG laser beam, or a carbon dioxide laser beam.

Figure 9:
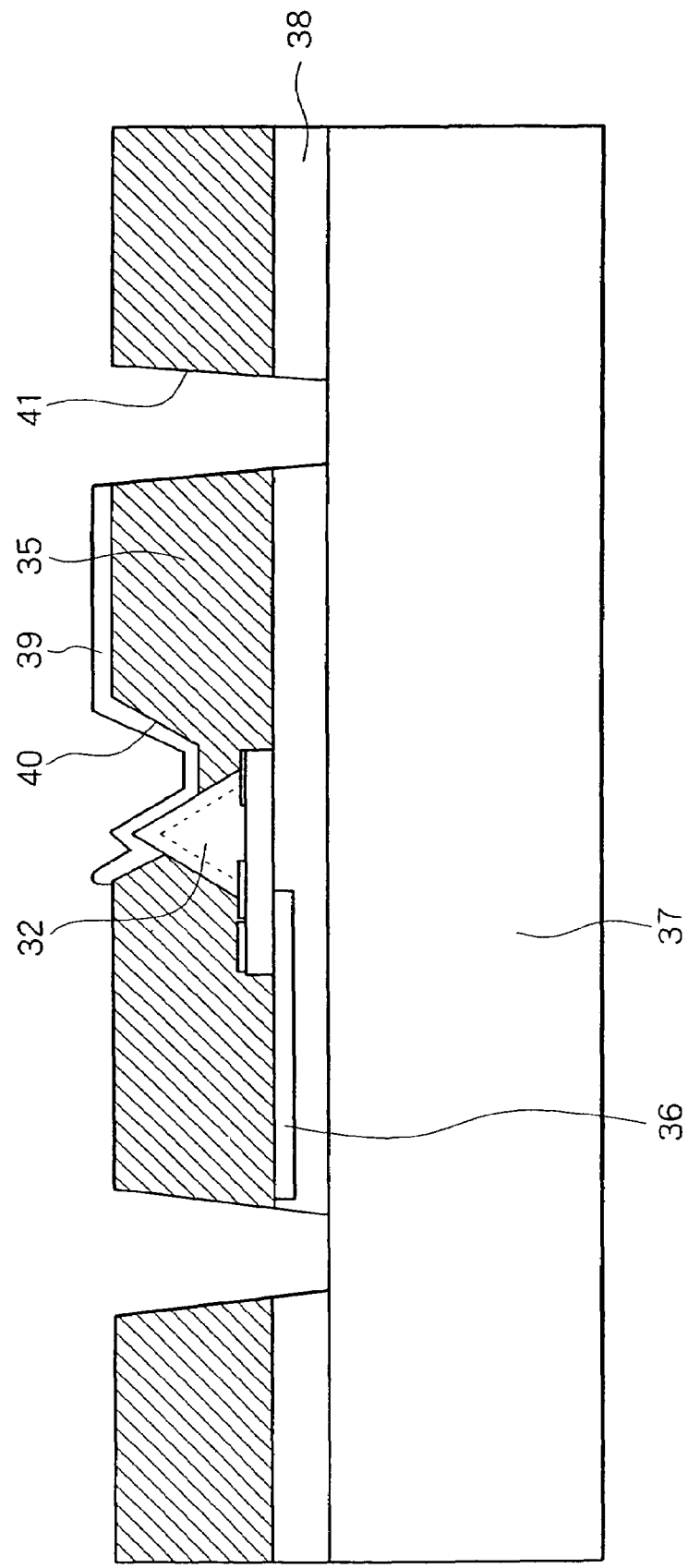
FIG. 9 is a schematic sectional view showing an electrode pad formation step and a dicing step after transfer of each device on a second temporarily holding member.

Referring to FIG. 9, after the light emitting diode 32 is transferred from the temporarily holding member 33 to a second temporarily holding member 37, a via-hole 40 on an anode electrode (p-electrode) side is formed in the adhesive layer 35 and an anode side electrode pad 39 is formed so as to be buried in the via-hole 40. Then, the adhesive layer 35 made from the resin is diced. As a result of dicing, device isolation grooves 41 are formed to isolate the light emitting diode 32 from the adjacent light emitting diodes 32. To isolate the light emitting diodes 32 arrayed in a matrix from each other, the device isolation grooves 41 have a planar pattern composed of a number of parallel lines extending in the vertical and horizontal directions. The bottom of the device isolation groove 41 faces to a surface of the second temporarily holding member 37. The second temporarily holding member 37 is exemplified by a so-called dicing sheet composed of a plastic substrate coated with an UV adhesive whose adhesive strength becomes weak at the time of irradiation of ultraviolet rays.

In one example of the above-described process, the surface of the adhesive layer 35 is etched with oxygen plasma until the surface of the light emitting diode 32 is exposed. The via-hole 40 is formed by using an excimer laser, a harmonic YAG laser beam, or a carbon dioxide laser beam. The diameter of the via-hole 40 is set to about 3 to 7 µm. The anode side electrode pad 39 is made from Ni/Pt/Au. The dicing process may be performed by the above-described dicing using a laser beam. The cut-in width is dependent on the size of the light emitting diode 32 covered with the adhesive layer 35 made from the resin in a pixel of an image display unit. As one example, grooves each having a width of about 40 µm are formed by an excimer laser beam to form each chip shape.

The light emitting diode 32 is peeled from the second temporarily holding member 37 by using mechanical parts. At this time, a release layer 38 is formed on the second temporarily holding member 37. The release layer 38 is typically made from a fluorine coat material, silicone resin, a water soluble resin (for example, PVA), or polyimide. The light emitting diode 32 is irradiated with, for example, a YAG third harmonic laser beam from a back surface, on which the release layer 38 is formed, of the second temporarily holding member 37. As a result, if the release layer 38 is made from polyimide, peeling occurs at an interface between polyimide and the quartz substrate by abrasion of polyimide, so that the light emitting diode 32 can be easily peeled from the second temporarily holding member 37 by the mechanical parts.

Figure 10:
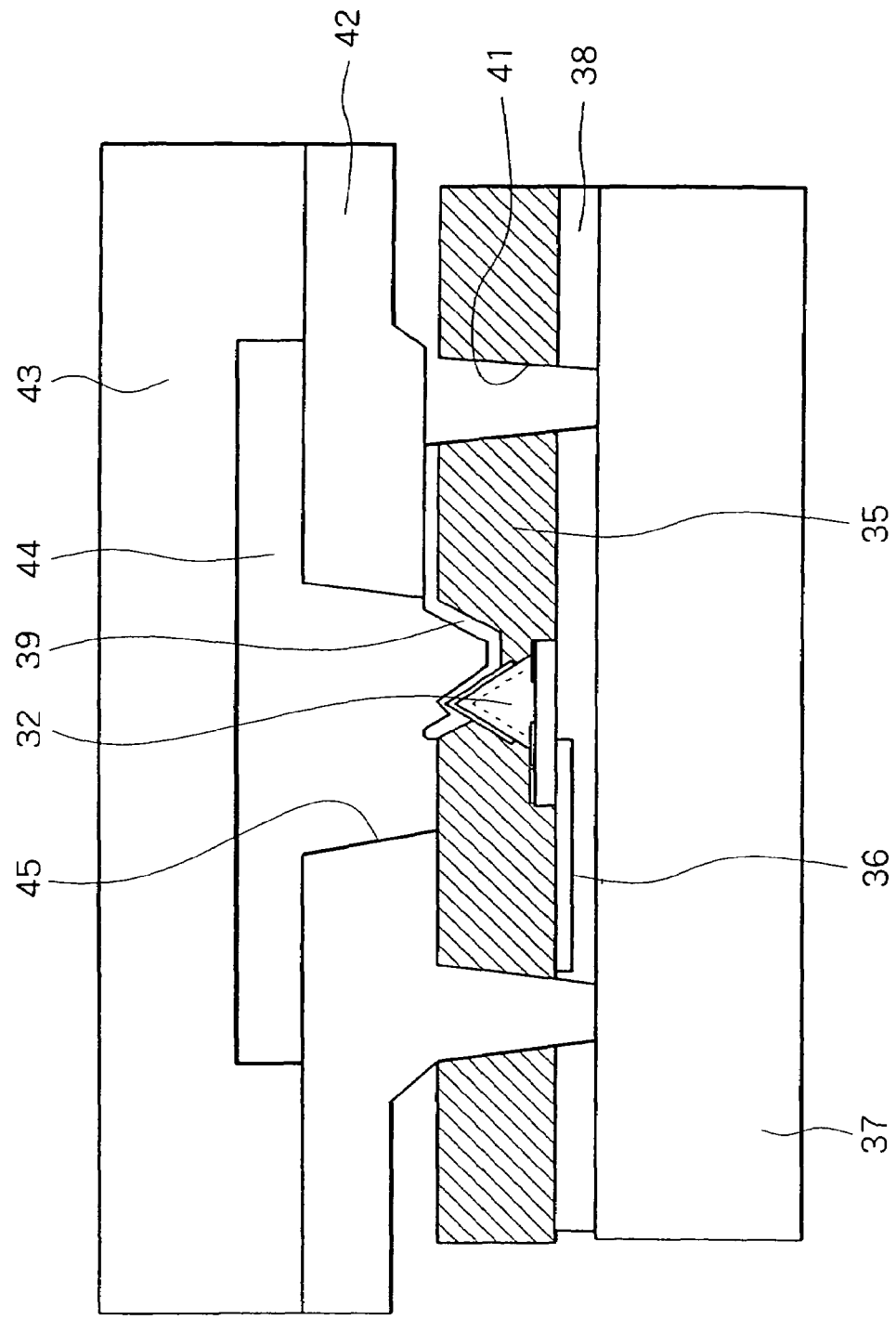
FIG. 10 is a schematic sectional view showing an attracting step.

FIG. 10 shows a state in which each of the light emitting diodes 32 arrayed on the second temporarily holding member 37 is picked up via an attracting system 43. The attracting system 43 has attracting holes 45 opened in a matrix corresponding to a pixel pitch of an image display unit in order to collectively attract a number of the light emitting diodes 32. The attracting holes 45, each having an opening diameter of about 100 μm, are arranged into a matrix with a pitch of 600 μm, and the attracting system 43 can collectively attract 300 pieces of the light emitting diodes 32. A portion of the attracting hole 45 is configured as a member having a hole, which is typically produced from Ni by an electroforming process, or as a metal plate such as a SUS plate 42 perforated by etching. An attracting chamber 44 is formed at the depth of the attracting hole 45 formed in the metal plate 42. By controlling the pressure in the attracting chamber 44 into a negative pressure, the attracting system 43 can attract the light emitting diode 32. Since each light emitting diode 32 is in a state being covered with the adhesive layer 35 whose surface is nearly flattened, the selective attraction of the light emitting device 32 by the attracting system 43 can be easily performed.

Figure 11:
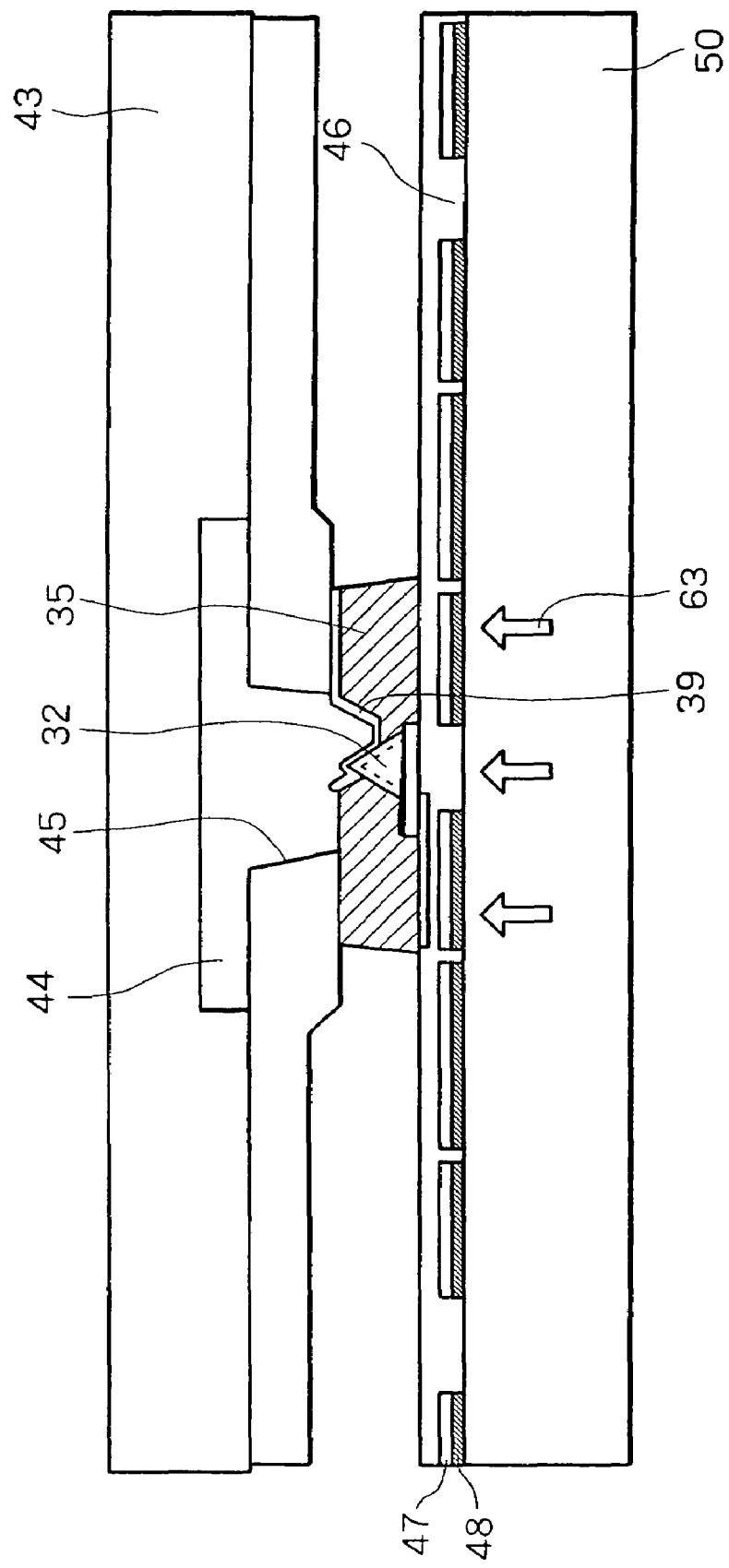
FIG. 11 is a schematic sectional view showing a second transfer step.

FIG. 11 is a view showing a state in which the light emitting diode 32 is transferred to a second substrate 50. An adhesive layer 46 is previously formed on the second substrate 50 before the light emitting diode 32 is transferred to the second substrate 50. By curing a portion, located on the back surface of the light emitting diode 32, of the adhesive layer 46, the light emitting diode 32 can be fixedly placed on the second substrate 50. At the time of this mounting, the pressure of the attracting chamber 44 of the attracting system 43 becomes high to release the coupling state between the light emitting diode 32 and the attracting system 43 by attraction. The adhesive layer 46 is made from an UV-curing type adhesive, a thermosetting adhesive, or a thermoplastic adhesive. In addition, the light emitting diodes 32 thus arrayed on the second substrate 50 are enlargedly spaced from each other with a pitch larger than the pitch of the light emitting diodes 32 held on the first temporarily holding member 33 and larger than the pitch of the light emitting diodes 32 held on the second temporarily holding member 37. An energy for curing the resin of the adhesive layer 46 is given from a back surface of the second substrate 50. A portion, located on the back surface of the light emitting diode 32, of the adhesive layer 46 may be cured by using ultraviolet rays if the adhesive layer 46 is made from an UV-curing type adhesive or cured by using a laser beam if the adhesive layer 46 is made from a thermosetting adhesive, to be adhesively bonded to the light emitting device 32. Alternatively, a portion, located on the back surface of the light emitting diode 32, of the adhesive layer 46 may be melted by laser irradiation if the adhesive layer 46 is made from a thermoplastic adhesive, to be adhesively bonded to the light emitting diode 32.

An electrode layer 47, which also functions as a shadow mask, is disposed on the second substrate 50. In particular, a black chromium layer 48 is formed on a surface, on the screen side, that is, on the viewer side, of the electrode layer 47. An advantage of provision of the black chromium layer 48 is to improve the contrast of an image. Another advantage of provision of the black chromium layer 48 is that since an energy absorptivity is increased by the black chromium layer 48, a portion, selectively irradiated with a beam 63, of the adhesive layer 46 can be early cured. If the adhesive layer 46 is made from an UV-curing type adhesive, it may be irradiated with ultraviolet rays having an energy of about 1,000 mJ/cm$^2$.

Figure 12:
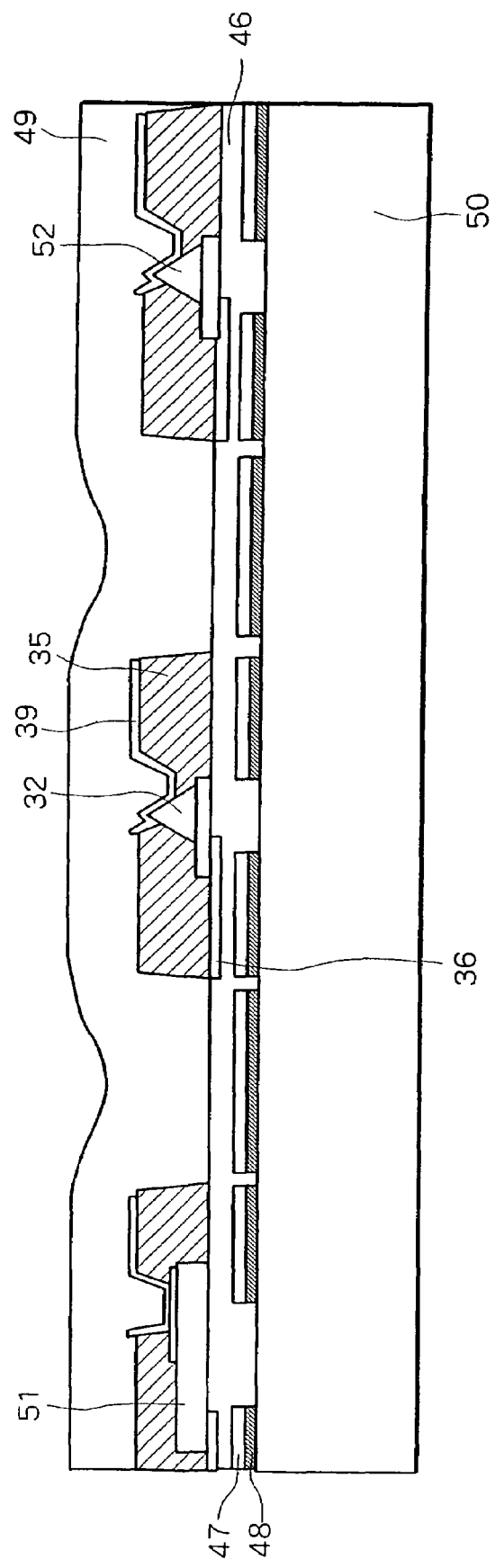
FIG. 12 is a schematic sectional view showing an insulating layer formation step.

FIG. 12 is a view showing a state in which light emitting diodes 32, 51, and 52 of three colors, RGB are arrayed on the second substrate 50 and are coated with an insulating layer 49. By mounting the light emitting diodes 32, 51, and 52 on the second substrate 50 at positions of the three colors, a pixel composed of the light emitting diodes 32, 51 and 52 of the three colors can be formed with a pixel pitch fixed. The insulating layer 49 may be made from a transparent epoxy adhesive, UV-curing type adhesive, or polyimide. The shapes of the light emitting diodes 32, 51, and 52 of the three colors are not necessarily identical to each other. In the example shown in FIG. 12, the red light emitting diode 51, which has a structure having no hexagonal pyramid shaped GaN layer, is different in shape from each of the other light emitting diodes 32 and 52. However, in this stage, each of the light emitting diodes 32, 51, and 52 has been already covered with the adhesive layer 35 to be formed into a resin-covered chip and, therefore, the light emitting diodes 32, 51, and 52 can be handled in the same manner irrespective of the difference in device structure between the light emitting diodes 32, 51, and 52.

Figure 13:
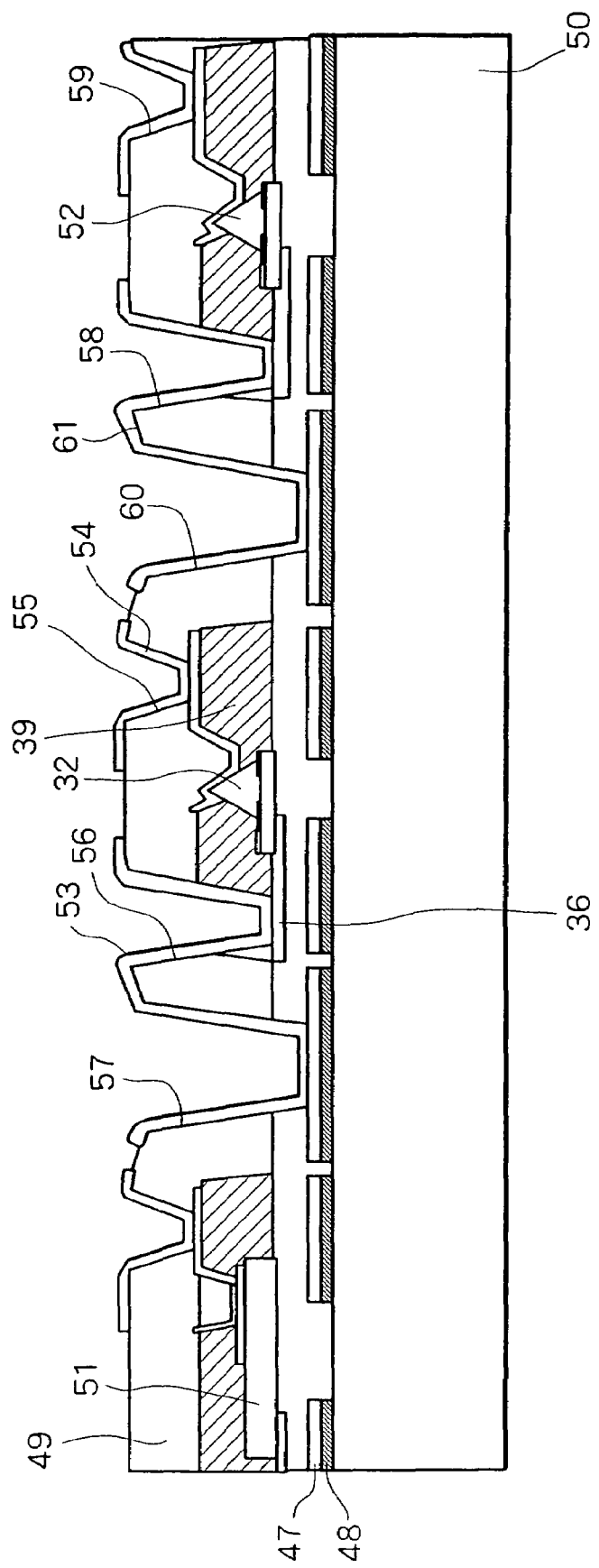
FIG. 13 is a schematic sectional view showing a wiring formation step.

As shown in FIG. 13, to electrically connect the electrode pads 36 and 39 of each of the light emitting diodes 32, 51 and 52 to the electrode layer 47 on the second substrate 50, opening portions (via-holes) 55, 56, 57, 58, 59, and 60 are formed in the insulating layer 49, followed by formation of wiring portions as will be described later. The formation of the opening portions is performed, for example, by using a laser beam.

Since the areas of the electrode pads 36 and 39 of each of the light emitting diodes 32, 51, and 52 are large, the shapes of the opening portions, that is, via-holes 55, 56, 57, 58, 59 and 60, can be made large. As a result, the positioning accuracy of each via-hole may be made rough as compared with a via-hole directly formed in each light emitting diode. For example, for each of the electrode pads 36 and 39 having a size of about 60 μm square, the via-hole having a diameter of about 20 μm can be formed. The via-holes are of three kinds having different depths, which are connected to the second substrate (wiring substrate), the anode electrode, and the cathode electrode. The depth of each via-hole is optimized by controlling the pulse number of a laser beam depending on the kind of the via-hole.

After the opening portions 55, 56, 57, 58, 59 and 60 are formed in the insulating layer 49, the wiring portions 53, 54, and 61 for connecting the electrode pads already connected to the anodes and cathodes of each of the light emitting diodes 32, 51 and 52 to the wiring electrode layer 47 formed on the second substrate 50 are formed. A protective layer is then formed on the wiring, to accomplish a panel of an image display unit. The protective layer may be made from the transparent epoxy adhesive used for the insulating layer 49 shown in FIG. 12. The protective layer is heated to be cured, to perfectly cover the wiring. After that, a driver IC is connected to the wiring at the end portion of the panel to produce a drive panel.

In the above-described method of arraying light emitting devices, since the light emitting diodes 32 are already enlargedly spaced from each other on the temporarily holding member 33, the relatively large electrode pads 36 and 39 can be provided by making use of the large distance between adjacent two of the devices 32, and since the wiring is performed by making use of the relatively large electrode pads 36 and 39, even if the size of the final unit is significantly larger than the device size, the wiring can be easily formed. Also, according to the method of arraying light emitting devices in this embodiment, since each light emitting device 32 is covered with the cured adhesive layer 35 which is flattened, the electrode pads 36 and 39 can be accurately formed on the flattened front and back surfaces of the adhesive layer 35 and can be disposed to extend to a region wider than the device size, so that the handling of the light emitting device 32 by the attracting jig in the second transfer step can be facilitated.

Figure 14:
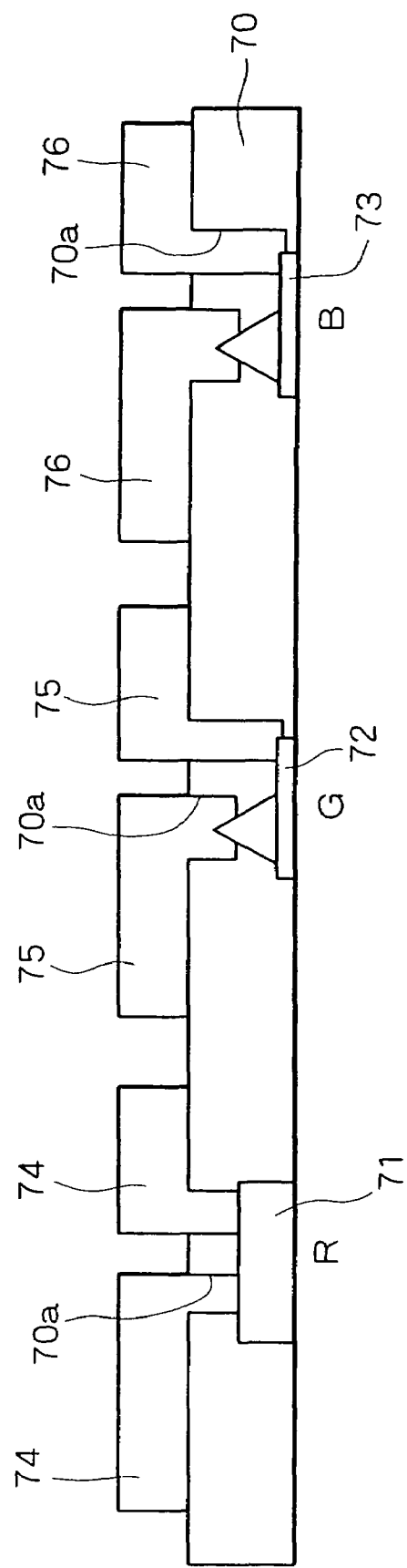
FIG. 14 is a schematic sectional view showing one example of a display device in which a number of light emitting devices are buried in an insulating material.

Modification:

A modification of the display device of the present invention and a display unit using the same will be described below. FIG. 14 shows a modification of the display device of the present invention, in which a number of light emitting devices are buried in an insulating material. In this modification, a first light emitting device 71 for allowing emission of light of red, a second light emitting device 72 allowing emission of light of green, and a third light emitting device 73 allowing emission of light of blue are buried in an insulating material 70 in such a manner as to be spaced from each other nearly at equal intervals. While each of the second and third light emitting devices 72 and 73 is of a pyramid shape type, the first light emitting device 71 is of a planar type. In this way, the light emitting devices 71, 72 and 73 buried in the insulating layer 70 may have structures different from each other. Drive electrodes 74 are connected to the light emitting device 71, drive electrodes are connected to the light emitting device 72, and drive electrodes 76 are connected to the light emitting device 73. In this case, as shown in FIG. 14, the connection state for the planar light emitting device 71 is different from that for the pyramid shaped light emitting device 72 or 73. However, according to this modification, since all of the light emitting devices 71, 72 and 73 (including the leading ends for the light emitting devices 72 and 73) are buried in the insulating material 70, the drive electrodes 74, 75 and 76 are similarly connected to the light emitting devices 71, 72 and 73 via opening portions 70a formed in the insulating material 70.

The display device shown in FIG. 1 is configured such that only one light emitting device is buried in the insulating material. On the other hand, the display device of this modification is modularized by collectively burying a set of the light emitting devices of R (red), G (green) and B (blue) in the insulating material. Such a modularized display device can further simplify the handling of the light emitting devices. In addition, the set of a number of the light emitting devices is not necessarily limited to the above-described set of the light emitting devices of R, G and B but may be a set of light emitting devices of the same color, for example, a set of light emitting devices of R, R, and R, G, G and G, or B, B and B. The number of light emitting devices forming one display device may be freely determined.

Figure 15:
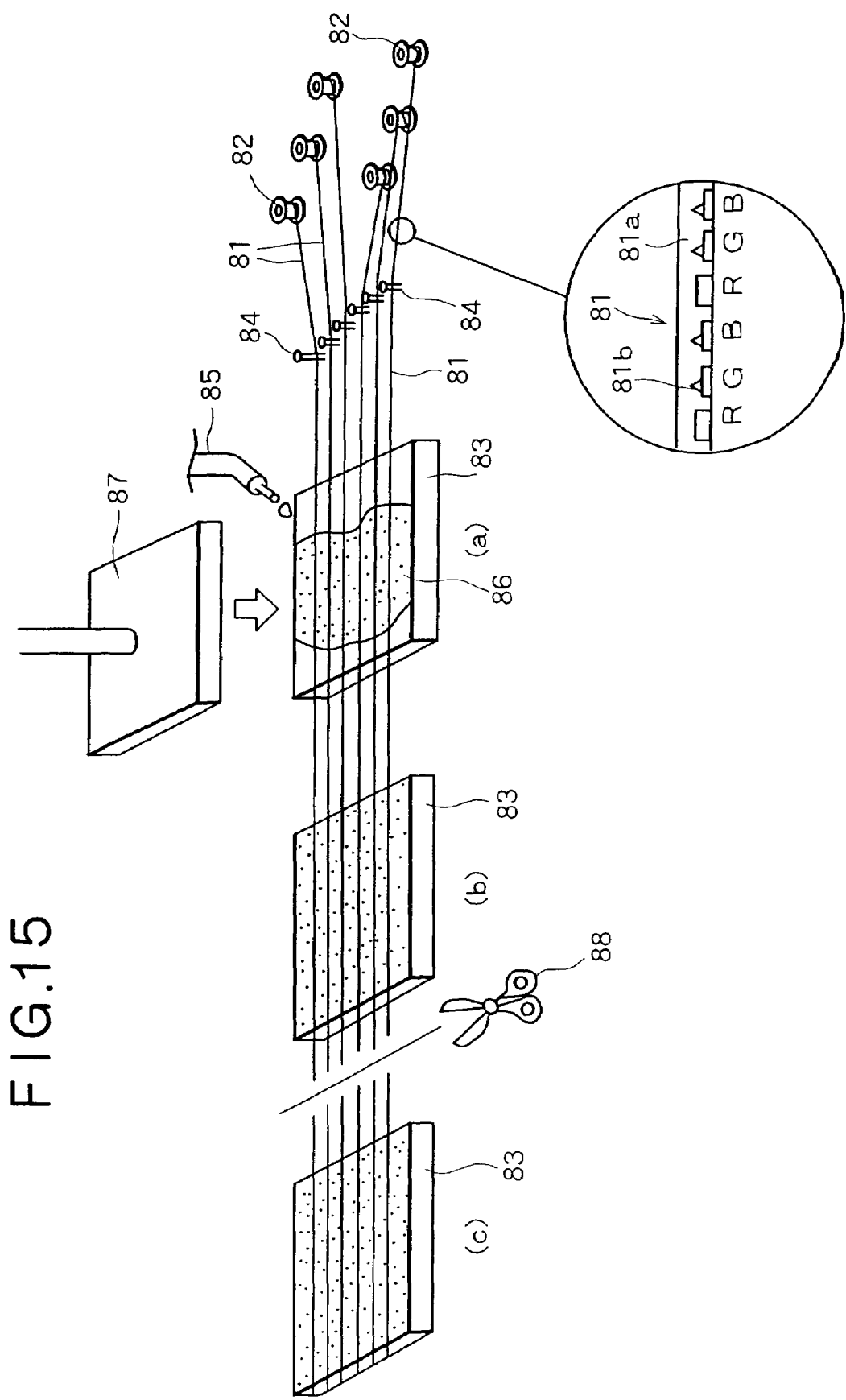
FIG. 15 is a schematic perspective view illustrating a process of producing a display unit by using linear display devices.

Production of Display Unit by Using Linear Display Device:

A further variation of the above-described method of burying a number of light emitting devices in an insulating material will be described below. According to a production process of this variation, a display unit is produced by preparing a number of linear insulating materials in each of which light emitting devices are arrayed in a row, and arraying these linear insulating materials onto a base body in such a manner that the linear insulating materials are disposed in parallel to each other with a pitch corresponding to a pitch of scanning lines. FIG. 15 shows one example of the production process of preparing display devices composed of linear insulating materials in each of which light emitting devices are arrayed in a row, and sequentially supplying the display devices, thereby producing the display unit.

In this production process, linear display devices 81 wound around rollers 82 are sequentially unrolled, to be arrayed on a substrate 83 placed at a position (a) in the FIG. 15. An interval between adjacent two of the display devices 81 is restricted by position restricting pins 84. Accordingly, a number of the linear display devices 81 are arrayed on the substrate 83 at equal intervals. The interval between adjacent two of the display devices 81 is equal to an interval between adjacent two of scanning lines.

As shown in an enlarged partial view, which is enclosed by a circle in FIG. 15, each of the linear display devices 81 is configured such that light emitting devices 81b are buried in a linear insulating material 81a in a row. With this configuration of the display device 81, it is not required to individually handle the light emitting devices 81b. Accordingly, at the time of assembling the display unit, it is possible to significantly improve the assembling efficiency. In addition, according to this variation, the light emitting devices 81b arrayed in a row, which form each display device 81, are configured by repeating a combination unit of the light emitting devices of R, G and B. However, the light emitting devices 81b arrayed in a row, which form each display device 81, may be configured by repeating light emitting devices of each of the three colors R, G and B. For example, of the three display devices 81, the first one may include the light emitting devices 81b of R, R, R, . . . , the second one may include the light emitting devices 81b of G, G, G, . . . , and the third one may include the light emitting devices 81b of B, B, B, . . . , and a display unit is assembled by using a set of the above three display devices 81.

The linear display device 81 can be obtained by sequentially supplying, at the time of linearly extruding an insulating material such as a resin, light emitting devices in the molten resin. Alternatively, the linear display device 81 can be obtained by extending a resin material in which light emitting devices are previously contained, thereby arraying the light emitting devices in a row. The linear display device 81 can be of course formed by making use of a transfer technique. In addition, the linear display device 81 may be formed into an any shape such as a circular shape in cross-section, an elliptic shape in cross-section, a square shape in cross-section, or a rectangular shape in cross-section.

The display unit is assembled in the following manner. The substrate 83 is supplied in sequence to the position (a) in FIG. 15, and the linear display devices 81 are arrayed on the substrate 83. In such a state, an adhesive 86 is supplied on the substrate 83 by an adhesive supplier 85, and is pressed and cured by a pressing plate 87. As a result of curing the adhesive 86, the display devices 81 are fixed on a surface of the substrate 83. The adhesive supplier 85 may be of any type such as a nozzle type; however, from the viewpoint of uniformly supplying the adhesive 86 on the substrate 83, a curtain coater may be used as the adhesive supplier 85. If the adhesive 86 is a thermosetting type adhesive such as an epoxy resin type adhesive, the pressing plate 87 preferably has a heating mechanism.

After the adhesive 86 is cured, the substrate 83 is moved to a position (b) and at the same time, a new substrate 83 is placed at the position (a). At this time, since the linear display devices 81 are pulled out by the substrate 83 moved to the position (b) and are continuously supplied to the new substrate 83. At the next step, the substrate 83 at the position (b) is moved to a position (c) and is cut off by cutter 88. Both ends of the display devices 81 thus cut off are then re-cut so as to make lengths of the display devices 81 equal to each other, to accomplish a display panel.

According to the above-described process, since the display device 81 in each of which the light emitting devices 81b are arrayed in an insulating material can be continuously supplied onto the substrate 83, it is possible to eliminate the need of individually handling the light emitting devices 81*b*. Accordingly, by supplying a number of the display devices 81 disposed in parallel to each other onto the substrate 83, it is possible to significantly improve the productivity of a display unit using the light emitting devices such as LEDs.

As described above, according to the present invention, since a display device is modularized by burying a light emitting device finely formed in an insulating material to re-shape the light emitting device into a size easy to handle, it is possible to ensure the handling performance of the light emitting device while suppressing the production cost thereof. For example, the use of the modularized display device is effective to easily carry the light emitting device in the form of a resin-covered chip. Also, since drive electrodes for a light emitting device are formed so as to be extracted on a surface of the modularized display device, a power source line and a signal line formed on a base body can be simply connected to the drive electrodes, so that it is possible to significantly facilitate the mounting of the light emitting device on the base body.

Although the present invention has been described with reference to specific embodiments, those of skill in the art will recognize that changes may be made thereto without departing from the spirit and scope of the invention as set forth in the hereafter appended claims.

The invention claimed is:

1. A display unit, comprising:
   a plurality of linear insulating materials;
   a plurality of scanning lines;
   a plurality of light emitting devices buried in each of the linear insulating materials in an array of a single row extending linearly, wherein
   the plurality of linear insulating materials are arrayed in parallel with each other with a pitch corresponding to a pitch of the scanning lines.

2. A display unit as claimed in claim 1, wherein red light emitting devices, blue light emitting devices and green light emitting devices are sequentially buried in each of the linear materials.

3. A display unit as claimed in claim 1, wherein a first linear material in which red light emitting devices are buried, a second linear material in which blue light emitting devices are buried, and a third linear material in which green light emitting devices are buried, are sequentially arrayed.

4. An apparatus for producing a display unit, comprising:
   a substrate supplier for supplying a substrate;
   a linear material supplier for supplying a plurality of linear materials simultaneously onto the substrate, wherein each linear material includes a plurality of light emitting devices buried and formed in an array of single row extending linearly in the linear material, and wherein the linear materials are arrayed in parallel so as to correspond to scanning lines;
   and adhesive supplier for supplying an adhesive, adapted to affix the linear materials to the substrate, onto the substrate; and
   a cutting mechanism for cutting the linear materials.

5. An apparatus for producing a display unit as claimed in claim 4, further comprising a pressing plate for pressing the adhesive, which has been supplied onto the substrate, to the substrate.

6. An apparatus for producing a display unit as claimed in claim 5, wherein the pressing plate includes a heating mechanism.

* * * * *